US012320715B2

(12) United States Patent
Shibuya et al.

(10) Patent No.: US 12,320,715 B2
(45) Date of Patent: Jun. 3, 2025

(54) ELECTROCONDUCTIVE FILM AND TEMPERATURE SENSOR FILM (71) Applicant: NITTO DENKO CORPORATION, Ibaraki (JP)

(72) Inventors: Katsunori Shibuya, Ibaraki (JP); Kazuhiro Nakajima, Ibaraki (JP); Kodai Miyamoto, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 445 days.

(21) Appl. No.: 17/765,681

(22) PCT Filed: Sep. 16, 2020

(86) PCT No.: PCT/JP2020/035025
§ 371 (c)(1),
(2) Date: Mar. 31, 2022

(87) PCT Pub. No.: WO2021/065502
PCT Pub. Date: Apr. 8, 2021

(65) Prior Publication Data
US 2022/0364937 A1   Nov. 17, 2022

(30) Foreign Application Priority Data
Oct. 1, 2019   (JP) .................... 2019-181492

(51) Int. Cl.
G01K 7/18   (2006.01)
G01K 7/16   (2006.01)
(Continued)

(52) U.S. Cl.
CPC ............ *G01K 7/183* (2013.01); *G01K 7/186* (2013.01); *H01B 5/14* (2013.01); *H01B 13/0036* (2013.01);
(Continued)

(58) Field of Classification Search
CPC ...... H01C 17/075; H01C 7/021; H01C 7/006; G01K 7/186
See application file for complete search history.

(56) References Cited

U.S. PATENT DOCUMENTS 6,143,206 A    11/2000  Handa et al.
6,350,844 B1 * 2/2002  Ono .................. H05K 1/0346
                                                   528/229
(Continued)

FOREIGN PATENT DOCUMENTS

CN    1462044 A    12/2003
CN    1183557 C     1/2005
(Continued)

OTHER PUBLICATIONS

Extended (Supplementary) European Search Report dated Sep. 11, 2023, issued in counterpart EP Application No. 20871047.5. (9 pages).
(Continued)

*Primary Examiner* — Kyung S Lee
(74) *Attorney, Agent, or Firm* — WHDA, LLP (57) ABSTRACT

Provided is an electroconductive film having a metal thin-film on a resin film base; and a temperature sensor film which is obtained by patterning the metal thin-film on the resin film base. An electroconductive film (101) which is used for the production of a temperature sensor film comprises a metal thin-film (10) on one principal surface of a resin film base (50), with a chromium oxide thin-film (21) serving as an underlying layer interposed therebetween. A temperature sensor film is obtained by patterning the metal thin-film so as to form a thermometric resistor part and a lead part that is connected to the thermometric resistor part.

12 Claims, 2 Drawing Sheets

(51) Int. Cl.
    *H01B 5/14*     (2006.01)
    *H01B 13/00*     (2006.01)
    *H01C 7/00*     (2006.01)
    *H01C 7/02*     (2006.01)
    *H01C 17/075*     (2006.01)

(52) U.S. Cl.
    CPC ............ *H01C 7/006* (2013.01); *H01C 7/021* (2013.01); *H01C 17/075* (2013.01); *G01K 2007/163* (2013.01); *G01K 2217/00* (2013.01)

(56) References Cited

U.S. PATENT DOCUMENTS

| | | |
|---|---|---|
| 2004/0041683 A1 | 3/2004 | Tosaka et al. |
| 2004/0241979 A1* | 12/2004 | Faust ................ H01L 21/76831 |
| | | 257/E21.252 |
| 2012/0187399 A1 | 7/2012 | Fukuda et al. |
| 2013/0048597 A1 | 2/2013 | Tanabe et al. |
| 2017/0043554 A1 | 2/2017 | Fujino et al. |
| 2019/0164821 A1* | 5/2019 | Jaywant ............. H01L 23/5329 |

FOREIGN PATENT DOCUMENTS

| | | |
|---|---|---|
| CN | 105005404 A | 10/2015 |
| EP | 0257737 A2 | 3/1988 |
| JP | S62-293689 A | 12/1987 |
| JP | H03-131002 A | 6/1991 |
| JP | H03-155933 A | 7/1991 |
| JP | H03-212903 A | 9/1991 |
| JP | H04-329690 A | 11/1992 |
| JP | H07-333073 A | 12/1995 |
| JP | 2530840 B2 | 9/1996 |
| JP | 2003-183814 A | 7/2003 |
| JP | 2004-255706 A | 9/2004 |
| JP | 2005-091045 A | 4/2005 |
| JP | 2006-069074 A | 3/2006 |
| JP | 2006-261270 A | 9/2006 |
| JP | 2007-158182 A | 6/2007 |
| JP | 2013-045633 A | 3/2013 |

OTHER PUBLICATIONS

Office Action dated Jan. 9, 2024, issued in counterpart JP Application No. 2019-181492, with English translation. (11 pages).
Office Action dated Apr. 2, 2024, issued in counterpart JP Application No. 2019-181492, with English translation. (12 pages).
Notification of Transmittal of Translation of the International Preliminary Report on Patentability (Form PCT/ B/338) issued in counterpart International application No. PCT/JP2020/035025 mailed Apr. 14, 2022 with Forms PCT/IB/373 and PCT/ISA/237. (8 pages).
Office Action dated Jan. 17, 2024, issued in counterpart TW Application No. 109133329, with English translation. (13 pages).
Notification of Transmittal of Translation of the International Preliminary Report on Patentability (Form PCT/IB/338) issued in counterpart International application No. PCT/JP2020/03525 mailed Apr. 14, 2022 with Forms PCT/IB/373 and PCT/ISA/237. (8 pages).
Office Action dated Aug. 22, 2023, issued in counterpart JP Application No. 2019-181492, with English translation. (10 pages).
Office Action dated Jul. 26, 2024, issued in counterpart TW Application No. 109133329, with English translation. (15 pages).
Office Action dated Mar. 28, 2025, issued in counterpart CN Application No. 202080069066.X, with English translation. (15 pages).

* cited by examiner

ELECTROCONDUCTIVE FILM AND TEMPERATURE SENSOR FILM

TECHNICAL FIELD

The present invention relates to a temperature sensor film including a patterned metal thin-film formed on a film base, an electroconductive film used in production of the temperature sensor film, and a method for producing the same.

BACKGROUND ART

A large number of temperature sensors are used in electronic devices. As the temperature sensor, a thermocouple or a chip thermistor is generally used. In a case where temperatures at a plurality of locations in one plane are measured by a thermocouple, a chip thermistor, or the like, it is required to arrange the temperature sensor at each measurement point and connect the respective temperature sensors to a printed wiring board or the like, resulting in a complicated production process. In addition, in order to measure an in-plane temperature distribution, it is required to arrange a large number of sensors on a substrate, which causes an increase in cost.

Patent Document 1 proposes a temperature sensor film in which a metal film is disposed on a film base, and the metal film is patterned to form a thermometric resistor part and a lead part. In the form of patterning the metal film, the thermometric resistor part and the lead part connected to the thermometric resistor part can be formed from one layer of the metal film, and it is not required to connect individual thermometric sensors by wiring. In addition, since the film base is used, there are advantages in that the temperature sensor film is excellent in flexibility and is easy to cope with an increase in area.

In the temperature sensor in which the metal film is patterned, the temperature is measured by applying a voltage to the thermometric resistor part through the lead part and using a characteristic that a resistance value of the metal varies depending on the temperature. In order to increase temperature measurement accuracy, a material having a large change in resistance with respect to a change in temperature is preferable. Patent Document 2 discloses that nickel is about twice as sensitive to the temperature (change in resistance) as copper.

PRIOR ART DOCUMENTS

Patent Documents

Patent Document 1: JP 2005-91045 A
Patent Document 2: JP H7-333073 A

SUMMARY OF THE INVENTION

Problems to be Solved by the Invention

It is known that a metal such as nickel exhibits a characteristic (positive characteristic) in which the resistance is increased as the temperature is higher, and bulk nickel has a change rate of resistance (temperature coefficient of resistance; TCR) with respect to the increase in temperature is about 6,000 ppm/° C. On the other hand, as a result of forming a nickel thin-film on a resin film base by a sputtering method and evaluating characteristics thereof by the present inventors, the TCR is about half that of bulk nickel, and there is room for improvement in temperature measurement accuracy when used as a temperature sensor film.

As a result of conducting intensive studies in view of this point, it was found that the TCR was increased by forming the metal thin-film on the resin film base and then performing a heat treatment. However, it was determined that when the heat treatment was performed, the TCR was increased, but the metal thin-film was easily peeled off from the resin film base.

In view of the above problems, an object of the present invention is to provide an electroconductive film including a metal thin-film formed on a resin film base and having excellent adhesion of the metal thin-film.

Means for Solving the Problems

An electroconductive film for a temperature sensor includes an underlying layer including a chromium oxide thin-film formed on one principal surface of a resin film base, and a metal thin-film formed on the underlying layer. By disposing the chromium oxide thin-film on the resin film base as the underlying layer and disposing the metal thin-film on the chromium oxide thin-film directly or with another inorganic thin-film interposed therebetween, adhesion of the metal thin-film tends to be improved.

A temperature sensor film can be formed by patterning the metal thin-film of the electroconductive film. The temperature sensor film includes the underlying layer and the patterned metal thin-film formed on one principal surface of the resin film base, and the metal thin-film is patterned into a thermometric resistor part and a lead part. The underlying layer and the metal thin-film may be disposed on both surfaces of the resin film base.

The thermometric resistor part is provided in a portion where temperature measurement is performed, and is patterned into a thin wire. The lead part is patterned to have a larger wiring width than that of the thermometric resistor part, and one end of the lead part is connected to the thermometric resistor part. The other end of the lead part is connected to an external circuit or the like. A connector may be connected to the lead part, and the connection to the external circuit may be performed through the connector.

The underlying layer may include a thin-film in addition to the chromium oxide thin-film. For example, a silicon-based thin-film such as silicon oxide may be disposed on the chromium oxide thin-film, and the metal thin-film may be formed on the silicon-based thin-film. A thickness of the metal thin-film is preferably 20 to 500 nm. A temperature coefficient of resistance of the metal thin-film is preferably 3,000 ppm/° C. or more. The metal thin-film may be a nickel-based thin-film formed of nickel or a nickel alloy.

Effects of the Invention

An electroconductive film in which a metal thin-film is disposed on a resin film base with a chromium oxide thin-film interposed therebetween and the temperature sensor film in which the metal thin-film of the electroconductive film is patterned are provided. The electroconductive film and the temperature sensor film have high adhesion of the metal thin-film, and are excellent in processability, durability, and reliability.

MODE FOR CARRYING OUT THE INVENTION

Figure 1:
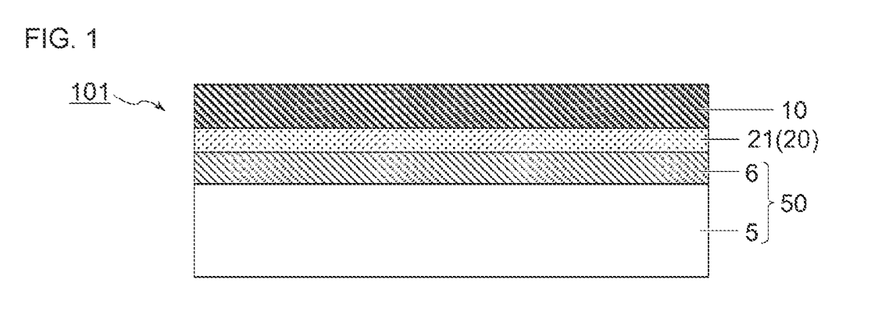
FIG. 1 is a cross-sectional view illustrating an example of a stacking configuration of an electroconductive film.
Figure 2:
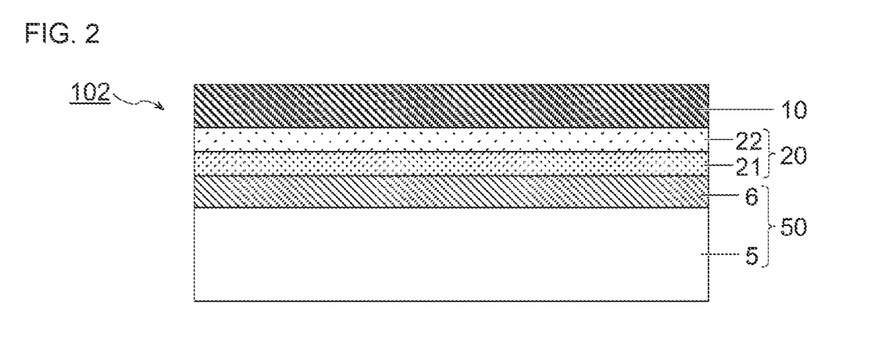
FIG. 2 is a cross-sectional view illustrating an example of a stacking configuration of an electroconductive film.
Figure 3:
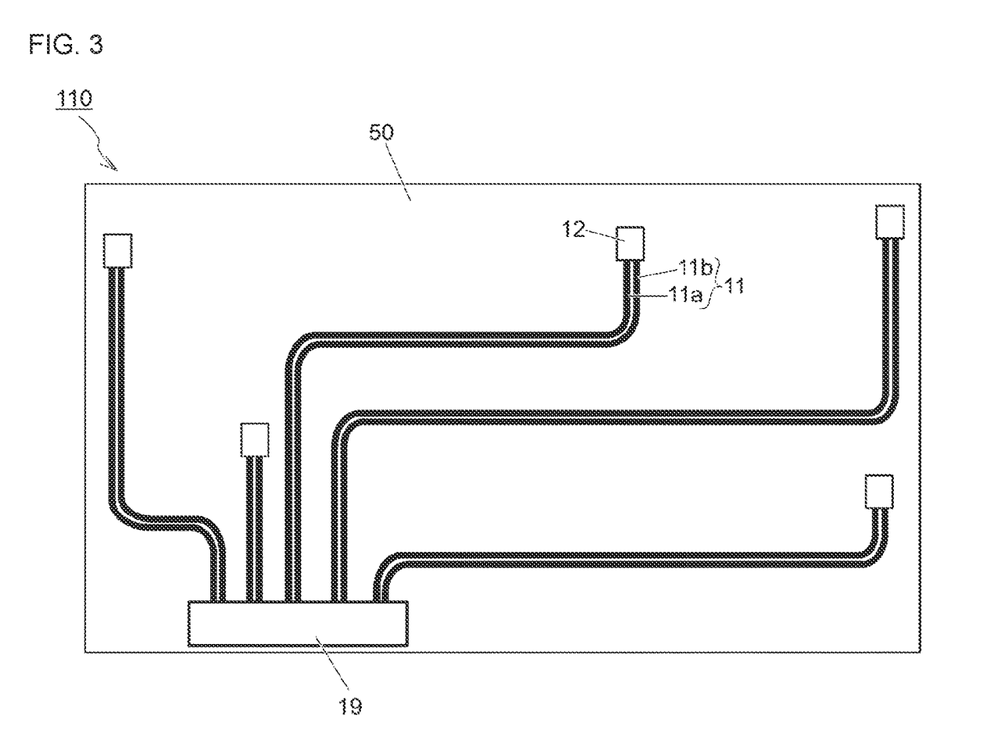
FIG. 3 is a plan view of a temperature sensor film.

FIGS. 1 and 2 are cross-sectional views illustrating examples of a stacking configuration of an electroconductive film used for forming a temperature sensor film, in which a metal thin-film 10 is disposed on one principal surface of a resin film base 50, and an underlying layer 20 is disposed between the resin film base 50 and the metal thin-film 10. The metal thin-films 10 of electroconductive films 101 and 102 are patterned, such that a temperature sensor film 110 illustrated in a plan view of FIG. 3 is obtained.

Electroconductive Film

<Resin Film Base>

The resin film base 50 may be transparent or non-transparent. The resin film base 50 may be made of only a resin film, or may include a hard coat layer (cured resin layer) 6 formed on a surface of a resin film 5 as illustrated in FIGS. 1 and 2. A thickness of the resin film base 50 is, although not particularly limited, generally about 2 to 500 μm, and preferably about 20 to 300 μm.

An easily adhesive layer, an antistatic layer, and the like may be disposed on a surface of the resin film base 50 (in a case where the hard coat layer 6 is disposed, the surface of the resin film 5 and/or the surface of the hard coat layer 6). The surface of the resin film base 50 may be subjected to a treatment such as a corona discharge treatment, an ultraviolet irradiation treatment, a plasma treatment, or a sputter etching treatment in order to increase adhesion to the underlying layer 20.

(Resin Film)

Examples of a resin material of the resin film 5 include polyester such as polyethylene terephthalate, polyimide, polyolefin, cyclic polyolefin such as norbornene, polycarbonate, polyether sulfone, and polyarylate. Polyimide or polyester is preferable from the viewpoint of heat resistance, dimensional stability, electrical properties, mechanical properties, chemical resistance, and the like. A thickness of the resin film 5 is, although not particularly limited, generally about 2 to 500 μm, and preferably about 20 to 300 μm.

(Hard Coat Layer)

When a hard coat layer 6 is disposed on the surface of the resin film 5, hardness of the electroconductive film is improved so that scratch resistance is improved. The hard coat layer 6 can be formed, for example, by applying a solution containing a curable resin onto the resin film 5.

Examples of the curable resin include a thermosetting resin, an ultraviolet curable resin, and an electron beam curable resin. Examples of the type of curable resin include various resins such as polyester-based, acrylic, urethane-based, acrylic urethane-based, amide-based, silicone-based, silicate-based, epoxy-based, melamine-based, oxetane-based, and acrylic urethane-based resins.

Among them, an acrylic resin, an acrylic urethane-based resin, and an epoxy-based resin are preferable because these resins have high hardness, can be cured by ultraviolet rays, and have excellent productivity. In particular, an acrylic resin and an acrylic urethane-based resin are preferable because these resins have high adhesion to the chromium oxide thin-film included in the underlying layer. The ultraviolet curable resin encompasses ultraviolet curable monomer, oligomer, polymer, etc. Examples of the ultraviolet curable resin preferably used include resins having an ultraviolet polymerizable functional group, and among them, a resin containing, as a component, an acrylic monomer or oligomer having 2 or more, in particular, 3 to 6 ultraviolet polymerizable functional groups can be exemplified.

Fine particles may be contained in the hard coat layer 6. The fine particles are contained in the hard coat layer 6, such that a surface shape of the metal thin-film 10-forming surface of the resin film base 50 (a surface on which the underlying layer 20 to be formed) can be adjusted. As the fine particles, various metal oxide fine particles such as silica, alumina, titania, zirconia, calcium oxide, tin oxide, indium oxide, cadmium oxide, and antimony oxide, glass fine particles, crosslinked or uncrosslinked organic fine particles formed of polymers such as polymethyl methacrylate, polystyrene, polyurethane, an acrylic-styrene copolymer, benzoguanamine, melamine, and polycarbonate, silicone-based fine particles, and the like can be used without particular limitation.

An average particle diameter (average primary particle diameter) of the fine particles is preferably about 10 nm to 10 μm. When the hard coat layer contains fine particles having an average particle diameter in the order of submicron or micrometer (hereinafter, may be referred to as "microparticles"), such as about 0.5 μm to 10 μm, preferably about 0.8 μm to 5 μm, protrusions having a diameter in the order of submicron or micrometer are formed on the surface of the hard coat layer 6 (the surface of the resin film base 50) and the surface of thin-film disposed on the hard coat layer 6, so that slipperiness, blocking resistance, and scratch resistance of the electroconductive film tend to be improved.

When the particle diameter of the fine particle is in the order of submicron or micrometer, protrusions having a diameter similar to the particle diameter are formed, so that the surface tends to be smooth when viewed on a nanometer scale, and the temperature coefficient of resistance (TCR) of the metal thin-film tends to be increased. From the viewpoint of uniformly forming irregularities on the entire surface of the hard coat layer, the amount of microparticles in the hard coat layer is preferably 0.05 to 20 parts by weight, and more preferably 0.1 to 10 parts by weight, with respect to 100 parts by weight of the resin component.

When the hard coat layer contains fine particles having an average particle diameter of about 10 nm to 100 nm, preferably about 20 to 80 nm (hereinafter, may be referred to as "nanoparticles"), fine irregularities are formed on the surface of the hard coat layer 6 (the surface of the resin film base 50), and adhesion between the hard coat layer 6, the underlying layer 20, and the metal thin-film 10 tends to be improved. The amount of nanoparticles in the hard coat layer may be about 1 to 50 parts by weight with respect to 100 parts by weight of the resin component.

In a case where nanoparticles are used to improve the adhesion, the amount of nanoparticles in the hard coat layer may be 5 parts by weight or more, 10 parts by weight or more, or 15 parts by weight or more, with respect to 100 parts by weight of the resin component. As the amount of nanoparticles is larger, the adhesion to the thin-film formed on the hard coat layer tends to be improved. On the other hand, when the amount of nanoparticles is excessively large, crystallization of the metal thin-film is inhibited due to the surface irregularities, and the TCR may be decreased. Therefore, the amount of nanoparticles in the hard coat layer is preferably 40 parts by weight or less, and more preferably 30 parts by weight or less, with respect to 100 parts by weight of the resin component.

The amount of nanoparticles in the hard coat layer may be 25 parts by weight or less, 20 parts by weight or less, 15 parts by weight or less, 10 parts by weight or less, 5 parts by weight or less, or 3 parts by weight or less, with respect to 100 parts by weight of the resin component, and the hard coat layer may not contain nanoparticles. As described below, the chromium oxide thin-film as the underlying layer 20 is disposed on the resin film base 50, such that the adhesion of the metal thin-film 10 tends to be improved. Therefore, even in a case where the hard coat layer 6 does not contain nanoparticles, an electroconductive film having excellent adhesion of the metal thin-film 10 is obtained.

A solution for forming a hard coat layer (hard coat composition) preferably contains an ultraviolet polymerization initiator. Additives such as a leveling agent, a thixotropic agent, and an antistatic agent may be contained in the solution.

A thickness of the hard coat layer 6 is, although not particularly limited, preferably 0.5 μm or more, more preferably 0.8 μm or more, and still more preferably 1 μm or more, in order to realize high hardness. In consideration of ease of formation by application, the thickness of the hard coat layer is preferably 15 μm or less and more preferably 10 μm or less.

In a case where microparticles are contained in the hard coat layer, the thickness of the hard coat layer is equal to or less than the average primary particle diameter of the microparticles, protrusions are likely formed on the surface of the hard coat layer, which is advantageous for improving slipperiness, blocking resistance, and scratch resistance. On the other hand, in a case where the thickness of the hard coat layer is excessively smaller than the thickness of the microparticles, the fine particles fall off from the hard coat layer, which may cause deterioration of slipperiness, blocking resistance, and scratch resistance. The thickness of the hard coat layer is preferably 0.3 to 1.2 times and more preferably 0.5 to 1 time the average primary particle diameter of the microparticles.

An arithmetic mean roughness Ra of the underlying layer 20-forming surface of the resin film base 50 is preferably 20 nm or less, more preferably 10 nm or less, and still more preferably 5 nm or less. The arithmetic mean roughness Ra of the resin film base 50 may be 3 nm or less or 2 nm or less. By reducing a surface roughness of the base, a coverage of the thin-film (the underlying layer 20 and the metal thin-film 10) formed on the base is improved, and a dense film is easily formed, such that a specific resistance of the metal thin-film 10 tends to be decreased. In addition, as the surface roughness of the base is smaller, the metal thin-film is easily crystallized, and the TCR tends to be increased. The arithmetic mean roughness Ra is calculated in accordance with JIS B0601:2013 by deriving a roughness curve having a length of 1 μm from a 1 μm square image observed using a scanning probe microscope.

<Underlying Layer>

The electroconductive film 101 includes the underlying layer 20 arranged between the resin film base 50 and the metal thin-film 10. The underlying layer 20 may be a single layer, and may have a stack of two or more thin-films, as illustrated in FIG. 2. By disposing the underlying layer 20 formed of an inorganic material between the resin film base 50 and the metal thin-film 10, the temperature coefficient of resistance (TCR) of the metal thin-film 10 tends to be increased, and the temperature measurement accuracy in the temperature sensor film is improved. In addition, bending resistance may be improved by disposing the underlying layer 20.

The underlying layer 20 includes at least one layer of chromium oxide thin-film. By disposing the chromium oxide thin-film between the resin film base 50 and the metal thin-film 10, the adhesion of the metal thin-film 10 is improved, and peeling of the metal thin-film from the resin film base tends to be suppressed. As illustrated in FIG. 2, in a case where the underlying layer 20 includes a plurality of thin-films, it is preferable that the thin-film 21 that is in contact with the resin film base 50 (the hard coat layer 6 in a case where the hard coat layer is disposed) is a chromium oxide thin-film.

In general, the metal thin-film such as copper or nickel does not have sufficient adhesion to an organic material such as a resin film. In particular, in a case where the hard coat layer is disposed on the surface of the resin film, the hard coat layer smoothens the surface and thus anchor effect by the surface irregularities is hardly exhibited and the adhesion of the metal thin-film tends to be deteriorated. In addition, when the metal thin-film is formed on the resin film base and then is subjected to a heat treatment to improve crystallinity of the metal thin-film, a stress strain of an interface (organic/inorganic interface) between the resin film base and the metal thin-film is increased due to a change in dimension of the resin film base or a change in residual stress of the metal thin-film by the crystallization, and the adhesion of the metal thin-film may be deteriorated.

By disposing the chromium oxide thin-film on the resin film base 50, adhesion of the organic/inorganic interface is improved, and peeling of the metal thin-film 10 formed on the chromium oxide thin-film tends to be suppressed. The reason that the chromium oxide thin-film exhibits high adhesion to the resin material is considered to be an electrostatic interaction between a Cr atom and a polar functional group such as a carbonyl group or the like included in the resin, formation of a coordinate bond, formation of a charge transfer complex, and the like.

The underlying layer 20 may have a multilayer configuration including a chromium oxide thin-film and a thin-film formed of a material other than chromium oxide. The thin-film constituting the underlying layer 20 is preferably an inorganic material, from the viewpoint of suppressing mixing of carbon into the metal thin-film 10. The underlying layer 20 may be electroconductive or insulative. In a case where the thin-film 21 disposed immediately under the metal thin-film 10 is an electroconductive inorganic material (inorganic conductor), the thin-film 21 (or the entire underlying layer 20) may be patterned together with the metal thin-film 10 at the time of producing a temperature sensor film. In a case where the thin-film 21 is an insulating inorganic material (inorganic dielectric), the thin-film 21 may be patterned or may not be patterned.

Examples of the inorganic material include metal elements or semimetal elements such as Si, Ge, Sn, Pb, Al, Ga, In, Tl, As, Sb, Bi, Se, Te, Mg, Ca, Sr, Ba, Sc, Y, Ti, Zr, Hf, V, Nb, Ta, Mo, W, Mn, Tc, Re, Fe, Ru, Os, Ni, Co, Rh, Ir, Pd, Pt, Cu, Ag, Au, Zn, and Cd, and alloys, nitrides, oxides, carbides, and nitrogen oxides thereof.

In a case where an inorganic thin-film 22 is disposed between the chromium oxide thin-film 21 and the metal thin-film 10, a material of the inorganic thin-film 22 is preferably a silicon-based material. When the silicon-based thin-film 22 is disposed immediately under the metal thin-film 10, the TCR of the metal thin-film may be increased. Examples of the silicon-based material include silicon and silicon compounds such as silicon oxide, silicon nitride, and silicon carbide. Among them, silicon oxide is preferable in terms of excellent adhesion to the metal thin-film. By disposing a silicon oxide thin-film 22 having a high specific resistance immediately under the metal thin-film 10, a leakage current between wirings (patterned metal thin-film) tends to be reduced, and the temperature measurement accuracy of the temperature sensor film tends to be improved. Silicon oxide may be a stoichiometric composition ($SiO_2$) or may be a non-stoichiometric composition ($SiO_x$, x<2). In a non-stoichiometric silicon oxide ($SiO_x$), it is preferable $1.2 \leq x < 2$ is satisfied.

A thickness of the underlying layer 20 and a thickness of the thin-film constituting the underlying layer 20 are not particularly limited. A thickness of the chromium oxide thin-film is preferably 1 nm or more and more preferably 3 nm or more, from the viewpoint of improving the adhesion. The thickness of the chromium oxide thin-film may be 5 nm or more. The thickness of the chromium oxide thin-film is preferably 50 nm or less, more preferably 30 nm or less, and still more preferably 20 nm or less, from the viewpoint of improving productivity and reducing material costs. The thickness of the chromium oxide thin-film may be 15 nm or less or 10 nm or less.

In a case where the silicon-based thin-film 22 such as silicon oxide is disposed on the chromium oxide thin-film 21, a thickness of the silicon-based thin-film 22 is preferably 1 nm or more and more preferably 3 nm or more. The thickness of the silicon-based thin-film may be 5 nm or more, 7 nm or more, or 10 nm or more. The thickness of the silicon-based thin-film 22 is preferably 100 nm or less, more preferably 50 nm or less, and still more preferably 30 nm or less, from the viewpoint of improving productivity and reducing material costs. The thickness of the silicon-based thin-film 22 may be 25 nm or less, 20 nm or less, or 15 nm or less.

The total thickness of the underlying layer 20 is preferably 5 nm or more. As the thickness of the underlying layer 20 is larger, the effect of reducing damage to the resin film base during deposition of the metal thin-film or blocking outgas from the resin film base is enhanced. On the other hand, from the viewpoint of improving productivity and reducing material costs, the total thickness of the underlying layer is preferably 150 nm or less, more preferably 100 nm or less, and still more preferably 50 nm or less.

<Metal Thin-Film>

The metal thin-film 10 disposed on the underlying layer 20 plays a central role in the temperature measurement in the temperature sensor. By patterning the metal thin-film 10, a lead part 11 and a thermometric resistor part 12 are formed as illustrated in FIG. 3. By disposing the metal thin-film 10 on the resin film base 50 with the chromium oxide thin-film as the underlying layer 20 interposed therebetween, the adhesion of the metal thin-film tends to be improved, such that peeling can be suppressed during processing of the temperature sensor film or in the use environment.

Examples of the metal material constituting the metal thin-film 10 include copper, silver, aluminum, gold, rhodium, tungsten, molybdenum, zinc, tin, cobalt, indium, nickel, iron, platinum, palladium, tin, antimony, bismuth, magnesium, and an alloy thereof. Among them, nickel, copper, or an alloy containing them as a main component (containing 50 wt % or more) is preferable, and nickel or a nickel alloy containing nickel as a main component is particularly preferable, in terms of low resistance, a high TCR, and an inexpensive material.

The thickness of the metal thin-film 10 is, although not particularly limited, preferably 20 nm or more, more preferably 40 nm or more, and still more preferably 50 nm or more, from the viewpoint of reducing resistance (in particular, from the viewpoint of reducing resistance of the lead part). On the other hand, from the viewpoint of shortening the deposition time, improving the patterning accuracy, and the like, the thickness of the metal thin-film 10 is preferably 500 nm or less, and more preferably 300 nm or less. In general, when the thickness of the metal thin-film is increased, the residual stress tends to be increased, and the adhesion to the resin film base tends to be deteriorated. In contrast, even in a case where the thickness of the metal thin-film is increased, the adhesion is improved by disposing the chromium oxide thin-film as an underlying layer, such that peeling of the metal thin-film from the resin film base can be suppressed.

In a case where the metal thin-film 10 is a nickel thin-film or a nickel alloy thin-film, a specific resistance at a temperature of 25° C. is preferably $1.6 \times 10^{-5}$ Ω·cm or less and more preferably $1.5 \times 10^{-5}$ Ω·cm or less. From the viewpoint of reducing the resistance of the lead part, the specific resistance of the metal thin-film is preferably as small as possible and may be $1.2 \times 10^{-5}$ Ω·cm or less or $1.0 \times 10^{-5}$ Ω·cm or less. The specific resistance of the metal thin-film is preferably as small as possible, but it is difficult to make the specific resistance smaller than that of bulk nickel, and the specific resistance is generally $7.0 \times 10^{-6}$ Ω·cm or more.

The TCR of the metal thin-film 10 is preferably 3,000 ppm/° C. or more, more preferably 3,400 ppm/° C. or more, still more preferably 3,600 ppm/° C. or more, and particularly preferably 3,800 ppm/° C. or more. The TCR is a rate of change in resistance with respect to an increase in temperature. A metal such as nickel or copper has a characteristic (positive characteristic) in which the resistance is linearly increased according to the increase in temperature. The TCR of the material having the positive characteristic is calculated from a resistance value $R_0$ at a temperature $T_0$ and a resistance value $R_1$ at a temperature $T_1$ by the following equation.

$$TCR = \{(R_1 - R_0)/R_0\}/(T_1 - T_0)$$

In the present specification, an average value of a TCR calculated from the resistance values at $T_0 = 25°$ C. and $T_1 = 5°$ C. and a TCR calculated from the resistance values at $T_0 = 25°$ C. and $T_1 = 45°$ C. is defined as the TCR of the metal thin-film.

As the TCR is larger, the change in resistance with respect to the change in temperature is increased, and the temperature measurement accuracy in the temperature sensor film is improved. Therefore, the TCR of the metal thin-film is preferably as large as possible, but it is difficult to make the TCR larger than that of a bulk metal, and the TCR of the metal thin-film is generally 6,000 ppm/° C. or less.

As described above, by disposing the underlying layer 20 on the resin film base 50 and forming the metal thin-film 10 on the underlying layer 20, the specific resistance of the metal thin-film tends to be decreased, and the TCR of the metal thin-film tends to be increased. In particular, by disposing the inorganic thin-film 22 such as silicon oxide on the chromium oxide thin-film 21, the TCR of the metal thin-film tends to be increased. In addition, in a case where an arithmetic mean roughness Ra of each of the resin film base 50 and the surface of the underlying layer 20 formed on the resin film base 50 is small, the specific resistance of the metal thin-film 10 tends to be decreased and the TCR of the metal thin-film 10 tends to be increased. Chromium oxide is likely to form a film having high smoothness, and the inorganic thin-film 22 formed on the film has also improved surface smoothness, which is considered to be one of the factors of improving the TCR of the metal thin-film 10.

An arithmetic mean roughness Ra of the surface of the metal thin-film 10 is preferably 20 nm or less, more preferably 15 nm or less, and still more preferably 10 nm or less. As the surface roughness of the metal thin-film 10 is smaller, the TCR tends to be increased, and the temperature measurement accuracy of the temperature sensor film in which the metal thin-film is patterned is improved according to the increase in TCR.

<Method for Forming Underlying Layer and Metal Thin-Film>

A method for forming the underlying layer 20 is not particularly limited, and either dry coating or wet coating can be adopted. In a case where the metal thin-film is formed by a sputtering method, it is preferable that the underlying layer 20 is also formed by the sputtering method from the viewpoint of productivity.

A method for forming the metal thin-film is not particularly limited, and for example, a deposition method such as a sputtering method, a vacuum deposition method, an electron beam deposition method, a chemical vapor deposition method (CVD), a chemical solution deposition method (CBD), or a plating method can be adopted. Among them, a sputtering method is preferable because a thin-film having excellent film thickness uniformity can be formed. By performing deposition while continuously moving the long resin film base in a longitudinal direction using a roll-to-roll sputtering apparatus, productivity of the electroconductive film is increased.

In deposition of the metal thin-film by roll-to-roll sputtering, it is preferable that a roll-shaped film base is loaded in the sputtering apparatus, and then, inside of the sputtering apparatus is exhausted before the start of the sputtering deposition to obtain an atmosphere in which impurities such as an organic gas generated from the film base are removed. By removing the gas in the apparatus and the film base in advance, the amount of moisture, organic gas, or the like mixed into the metal thin-film 10 can be reduced. A degree of vacuum (degree of ultimate vacuum) in the sputtering apparatus before the start of the sputtering deposition is, for example, $1 \times 10^{-1}$ Pa or less, preferably $5 \times 10^{-2}$ Pa or less, and more preferably $1 \times 10^{-2}$ Pa or less.

In sputtering deposition of the metal thin-film, a metal target is used, and the deposition is performed while an inert gas such as argon is introduced. For example, in a case where a nickel thin-film is formed as the metal thin-film 10, a metal Ni target is used. In a case where the underlying layer is formed by a sputtering method, a target may be selected according to the material of the underlying layer. For example, a metal Cr target or a chromium oxide target is used for forming the chromium oxide thin-film. In a case where a metal Cr target is used, the deposition by reactive sputtering is performed while a reactive gas such as oxygen is introduced into a chamber in addition to an inert gas such as argon. In the reactive sputtering, it is preferable to adjust the amount of oxygen so as to form an intermediate transition region between the metal region and the oxide region. In a case where a silicon thin-film is formed, a silicon target is used. In deposition of the silicon oxide thin-film, a silicon oxide target may be used, or silicon oxide may be formed by reactive sputtering using a silicon target.

The sputtering deposition conditions are not particularly limited. In order to suppress mixing of moisture, an organic gas, or the like into the metal thin-film, it is preferable to reduce damage to the resin film base during deposition of the metal thin-film. By disposing the underlying layer 20 including the chromium oxide thin-film on the resin film base 50 and forming the metal thin-film 10 on the underlying layer 20, plasma damage to the resin film base 50 during deposition of the metal thin-film 10 can be suppressed. In addition, by disposing the underlying layer 20, moisture, an organic gas, or the like generated from the resin film base 50 can be blocked, and mixing of moisture, an organic gas, or the like into the metal thin-film 10 can be suppressed.

In addition, generation of moisture or an organic gas from the resin film base can be suppressed by lowering the substrate temperature during deposition and lowering a discharge power density. The substrate temperature in the sputtering deposition of the metal thin-film is preferably 200° C. or lower, more preferably 180° C. or lower, and still more preferably 170° C. or lower. On the other hand, the substrate temperature is preferably −30° C. or higher from the viewpoint of prevention of embrittlement of the resin film base and the like. From the viewpoint of suppressing damage to the resin film base while stabilizing plasma discharge, the discharge power density is preferably 1 to 15 W/cm$^2$ and more preferably 1.5 to 10 W/cm$^2$.

Temperature Sensor Film

A temperature sensor film is formed by patterning the metal thin-film 10 of the electroconductive film. The underlying layer 20 may be patterned or may not be patterned. In a case where the layer formed immediately under the metal thin-film is an insulating material, it is not required to pattern the underlying layer 20.

As illustrated in FIG. 3, in the temperature sensor film, the metal thin-film includes a lead part 11 formed in a wiring shape and a thermometric resistor part 12 connected to one end of the lead part 11. The other end of the lead part 11 is connected to a connector 19.

The thermometric resistor part 12 is a region that acts as a temperature sensor, and the temperature measurement is performed by applying a voltage to the thermometric resistor part 12 through the lead part 11 and calculating the temperature from a resistance value thereof. By providing a plurality of thermometric resistor parts in a plane of a temperature sensor film 110, the temperatures at a plurality of locations can be simultaneously measured. For example, in the form illustrated in FIG. 3, the thermometric resistor parts 12 are provided at five locations in the plane.

FIG. 4A is an enlarged view of the vicinity of the thermometric resistor part in a two-wire temperature sensor. The thermometric resistor part 12 is formed by sensor wirings 122 and 123 in which a metal thin-film is patterned into a thin wire shape. In the sensor wiring, a plurality of vertical electrodes 122 are connected at the end thereof through the horizontal wiring 123 to form a hairpin-shaped bent part, thereby having a zigzag pattern.

As the wiring width of the thin wire constituting the pattern shape of the thermometric resistor part 12 is smaller (the cross-sectional area is smaller) and the line length from one end 121a to the other end 121b of the sensor wiring of the thermometric resistor part 12 is larger, the resistance between two points is larger, and a resistance change amount is also larger according to the change in temperature. Therefore, the temperature measurement accuracy is improved. By forming the zigzag wiring pattern as illustrated in FIG. 4, the area of the thermometric resistor part 12 can be decreased, and the length of the sensor wiring (line length from one end 121a to the other end 121b) can be increased.

Figure 4:
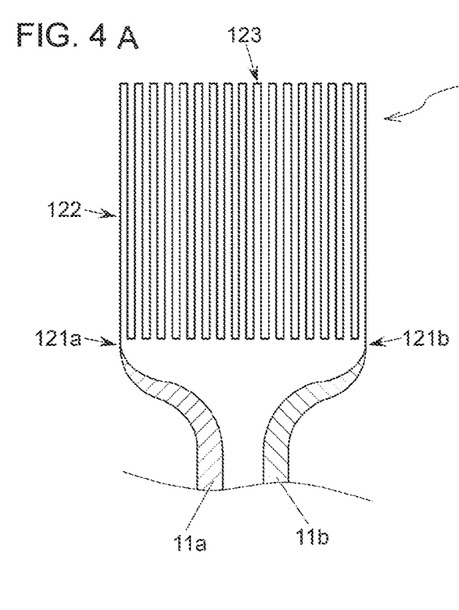
FIGS. 4A and 4B are each enlarged view of the vicinity of a thermometric resistor part in a temperature sensor, wherein FIG. 4A indicates a two-wire type and FIG. 4B indicates a four-wire type.

The pattern shape of the sensor wiring of the thermometric resistor part is not limited to the form as illustrated in FIG. 4, and may be a pattern shape such as a spiral shape.

The wiring width of the sensor wiring 122 (vertical wiring) and the distance (space width) between adjacent wirings may be set according to the patterning accuracy of photolithography. The wiring width and the space width are generally about 1 to 150 μm. The wiring width is preferably 3 μm or more and preferably 5 μm or more from the viewpoint of preventing disconnection of the sensor wiring. The wiring width is preferably 100 μm or less and more preferably 70 μm or less from the viewpoint of increasing the change in resistance and increasing the temperature measurement accuracy. The space width is preferably 3 to 100 μm and more preferably 5 to 70 μm from the same viewpoints.

Both the ends 121a and 121b of the sensor wiring of the thermometric resistor part 12 are connected to ends of the lead parts 11a and 11b, respectively. Two lead parts 11a and 11b are formed in an elongated pattern in a state of facing each other with a slight gap, and the other end of the lead part is connected to the connector 19. The lead part is formed wider than the sensor wiring of the thermometric resistor part 12 in order to secure a sufficient current capacity. Widths of the lead parts 11a and 11b are, for example, about 0.5 to 10 mm. The wiring width of the lead part is preferably 3 times or more, more preferably 5 times or more, and still more preferably 10 times or more the wiring width of the sensor wiring 122 of the thermometric resistor part 12.

The connector 19 has a plurality of terminals, and a plurality of lead parts are connected to different terminals, respectively. The connector 19 is connected to an external circuit, and a voltage is applied between the lead part 11a and the lead part 11b, such that a current flows through the lead part 11a, the thermometric resistor part 12, and the lead part 11b. A resistance value is calculated from a current value when a predetermined voltage is applied, or from an applied voltage when a voltage is applied so that the current becomes a predetermined value. The temperature is calculated from the resistance value based on a relational expression between the obtained resistance value and a temperature obtained in advance, a table in which a relationship between the resistance value and the temperature is recorded, and the like.

The resistance value obtained here includes the resistances of the lead part 11a and the lead part 11b in addition to the resistance of the thermometric resistor part 12. However, since the resistance of the thermometric resistor part 12 is sufficiently larger than the resistances of the lead parts 11a and 11b, the obtained measurement value can be regarded as the resistance of the thermometric resistor part 12. The lead part may be a four-wire type from the viewpoint of reducing the influence by the resistance of the lead part.

FIG. 4B is an enlarged view of the vicinity of the thermometric resistor part in a four-wire temperature sensor. The pattern shape of the thermometric resistor part 12 is identical to that in FIG. 4A. In the four-wire type, four lead parts 11a1, 11a2, 11b1, and 11b2 are connected to one thermometric resistor part 12. The lead parts 11a1 and 11b1 are voltage measurement leads, and the lead parts 11a2 and 11b2 are current measurement leads. The voltage measurement lead 11a1 and the current measurement lead 11a2 are connected to the end 121a of the sensor wiring of the thermometric resistor part 12, and the voltage measurement lead 11b1 and the current measurement lead 11b2 are connected to the other end 121b of the sensor wiring of the thermometric resistor part 12. In the four-wire type, the resistance value of only the thermometric resistor part 12 can be measured by excluding the resistance of the lead part, and thus, measurement with less error can be performed. In addition to the two-wire type and the four-wire type, a three-wire type may be adopted.

A method for pattering the metal thin-film is not particularly limited. Since the patterning is easy and accuracy is high, it is preferable to perform patterning by a photolithography method. In the photolithography, an etching resist corresponding to the shapes of the lead part and the thermometric resistor part are formed on the surface of the metal thin-film, the metal thin-film in a region in which the etching resist is not formed is removed by wet etching, and then, the etching resist is peeled off. The patterning of the metal thin-film can also be performed by dry etching such as laser processing.

In the above embodiment, the underlying layer 20 is disposed on the resin film base 50, the metal thin-film 10 is formed on the underlying layer 20 by a sputtering method or the like, and the metal thin-film is patterned, such that a plurality of each of lead parts and thermometric resistor parts can be formed in the plane of the substrate. A temperature sensor element is obtained by connecting the connector 19 to the end of the lead part 11 of the temperature sensor film. In this embodiment, the lead parts are connected to the plurality of thermometric resistor parts, and the plurality of lead parts may be connected to one connector 19. Therefore, it is possible to easily form a temperature sensor element capable of measuring temperatures at a plurality of locations in the plane.

In the above embodiment, the underlying layer and the metal thin-film are disposed on one principal surface of the resin film base. In contrast, the underlying layer and the metal thin-film may be disposed on both surface of the resin film base. In addition, the underlying layer and the metal thin-film may be disposed on one principal surface of the resin film base, and the thin-film having a different configuration may be disposed on the other principal surface.

A method for connecting the lead part of the temperature sensor film and the external circuit is not limited to the connection through the connector. For example, a controller for applying a voltage to the lead part and measuring the resistance may be provided on the temperature sensor film. In addition, the lead part and the lead wiring from the external circuit may be connected by soldering or the like without through the connector.

The temperature sensor film has a simple configuration in which a thin-film is disposed on a resin film base, and thus has excellent productivity, is easy to be processed, and can be applied to a curved surface. In addition, since the TCR of the metal thin-film is large, more accurate temperature measurement can be realized. Furthermore, in the embodiment of the present invention, the adhesion of the metal thin-film is high, and thus, a temperature sensor film that has excellent processability, durability, and reliability can be formed.

EXAMPLES

Hereinafter, the present invention will be described in more detail with reference to Examples, but the present invention is not limited to the following Examples.

Production of Film Base with Hard Coat Layer

A coating composition containing crosslinked polymethyl methacrylate particles having an average particle diameter of 1.5 μm ("TECHPOLYMER SSX-101" manufactured by Sekisui Kasei Co., Ltd.) and an ultraviolet curable urethane acrylate resin ("Aica Aitron Z844-22HL" manufactured by Aica Kogyo Company, Limited) and using methyl isobutyl ketone as a solvent was prepared. The amount of particles in the composition was 0.2 parts by weight with respect to 100 parts by weight of the solid content in the binder resin. The composition was applied to one surface of a polyethylene terephthalate (PET) film having a thickness of 150 μm ("Lumirror 149UNS" manufactured by Toray Industries, Ra=1.6 nm), and drying was performed at 100° C. for 1 minute. Thereafter, a curing treatment was performed by ultraviolet irradiation to form a hard coat layer having a thickness of 0.8 μm.

Example 1

A roll of a film base with the hard coat layer was set in a roll-to-roll sputtering apparatus, inside of the sputtering apparatus was exhausted until a degree of ultimate vacuum reached $5\times10^{-3}$ Pa, and then, a chromium oxide layer having a thickness of 7 nm and a nickel layer having a thickness of 250 nm were sequentially deposited on the hard coat layer-formed surface at a substrate temperature of 80° C. by DC sputtering. In deposition of the chromium oxide layer, a metal Cr target was used, oxygen was introduced as a reactive gas ($O_2$/Ar=1/8) in addition to argon as a sputtering gas, and deposition was performed under conditions of a pressure of 0.3 Pa and a power density of 1.4 W/cm$^2$. A nickel layer was deposited by introducing argon as a sputtering gas using a metal nickel target under conditions of a pressure of 0.3 Pa and a power density of 5.0 W/cm$^2$.

Example 2

A chromium oxide layer having a thickness of 7 nm, a silicon oxide ($SiO_2$) layer having a thickness of 10 nm, and a nickel layer having a thickness of 160 nm were sequentially deposited on a surface of the hard coat layer of the hard coat layer-equipped film by DC sputtering. In deposition of the $SiO_2$ layer, a B-doped Si target was used, oxygen was introduced as a reactive gas ($O_2$/Ar=1/8) in addition to argon as a sputtering gas, and deposition was performed under conditions of a pressure of 0.3 Pa and a power density of 1.4 W/cm$^2$. The deposition conditions of the chromium oxide layer and the nickel layer were the same as those of Example 1.

Comparative Example 1

A nickel layer having a thickness of 250 nm was deposited on a surface of the hard coat layer of the hard coat layer-equipped film under the same conditions as those of Example 1 without disposing an underlying layer.

Comparative Example 2

A silicon layer having a thickness of 5 nm, a $SiO_2$ layer having a thickness of 10 nm, and a nickel layer having a thickness of 250 nm were sequentially deposited on a surface of the hard coat layer of the hard coat layer-equipped film base by DC sputtering. In deposition of the Si layer, a B-doped Si target was used, argon was introduced as a sputtering gas, and deposition was performed under conditions of a pressure of 0.3 Pa and a power density of 1.0 W/cm$^2$. The deposition conditions of the $SiO_2$ layer and the nickel layer were the same as those of Example 2.

Comparative Example 3

A silicon layer having a thickness of 5 nm, a $SiO_2$ layer having a thickness of 10 nm, and a nickel layer having a thickness of 160 nm were deposited on a surface of a hard coat layer of a hard coat layer-equipped film base in the same manner as that of Example 2, except that the thickness of the nickel layer was changed to 160.

Evaluation

The electroconductive films of Examples and Comparative Examples were cut into A4 size, and the cut electroconductive films were subjected to a heat treatment in a hot air oven at 155° C. for 60 minutes. The following evaluations were performed for each of the films before and after the heat treatment.

Temperature Coefficient of Resistance (Preparation of Measurement Sample)

The electroconductive film was cut into a size of 10 mm×200 mm, the nickel layer was patterned into a stripe shape having a wiring width of 30 μm by laser patterning to form a thermometric resistor part having the shape illustrated in FIG. 4A. At the time of patterning, the length of the pattern was adjusted such that the total wiring resistance was about 10 kΩ and the resistance of the thermometric resistor part was 30 times the resistance of the lead part, thereby preparing a measurement sample (temperature sensor film).

(Measurement of Temperature Coefficient of Resistance)

In a small heating and cooling oven, the thermometric resistor part of the temperature sensor film was set to 5° C., 25° C., and 45° C. One tip and the other tip of the lead part were connected to a tester, a constant current was applied, and a voltage was read to measure a two-terminal resistance at each temperature. An average value of the TCR calculated from the resistance values at 5° C. and 25° C. and the TCR calculated from the resistance values at 25° C. and 45° C. was defined as a TCR of the nickel layer.

(Adhesion)

On the nickel thin-film-formed surface of the electroconductive film, using a cutter knife, cuts were made to form grids of 100 squares at intervals of 1 mm in each of vertical and horizontal directions. A peeling test was performed according to a grid test of former JIS-K5400, and the number of grids from which the thin-film was peeled off was counted in the region of ¼ or more of the area of the grids. The smaller the number, the higher the adhesion.

Stacking configurations (thickness of the hard coat (HC) layer, configuration of the underlying layer, and thickness of the Ni layer) of the electroconductive films of Examples and Comparative Examples and the evaluation results (TCR and adhesion) are shown in Table 1.

TABLE 1

| | Laminated configuration | | | Evaluation results | | |
|---|---|---|---|---|---|---|
| | | | After heating at 150° C. for 1 hr | | Before heat treatment | |
| | HC (nm) | Base layer | Ni (nm) | Adhesion | TCR (ppm/° C.) | Adhesion | TCR (ppm/° C.) |
| Example 1 | 1200 | CrO (7 nm) | 250 | 0 | 4437 | 2 | 4110 |
| Example 2 | 1200 | CrO (7 nm)/SiO$_2$ (10 nm) | 160 | 0 | 4339 | 0 | 4112 |
| Comparative Example 1 | 1200 | — | 250 | 89 | 4001 | 3 | 3918 |
| Comparative Example 2 | 1200 | Si (5 nm)/SiO$_2$ (10 nm) | 250 | 68 | 4095 | 0 | 3881 |
| Comparative Example 3 | 1200 | Si (5 nm)/SiO$_2$ (10 nm) | 160 | 8 | 3988 | 9 | 3899 |

In all Examples and Comparative Examples, the TCR tended to be increased after the heat treatment. This is considered to be because the crystallinity of the nickel thin-film was improved by the heat treatment.

In the case of the electroconductive film of Comparative Example 1 in which the nickel thin-film (250 nm) was formed directly on the hard coat layer of the film base without disposing an underlying layer, the adhesion was excellent before the heat treatment, but the adhesion was significantly deteriorated after the heat treatment. In Comparative Example 2 in which the silicon thin-film and the silicon oxide thin-film were disposed on the hard coat layer as an underlying layer and the nickel thin-film was formed on the underlying layer, the adhesion was improved in comparison to Comparative Example 1, but the adhesion was significantly deteriorated after the heat treatment as in Comparative Example 1. In Comparative Example 3 in which the thickness of the nickel thin-film was small, the adhesion was improved after the heat treatment in comparison to Comparative Example 2, but the TCR was decreased.

In Example 1 in which the chromium oxide thin-film was disposed on the hard coat layer as an underlying layer and the nickel thin-film (250 nm) was formed on the chromium oxide thin-film, the adhesion was excellent even after the heat treatment. In addition, the TCR in the electroconductive film of Example 1 was increased in comparison to those of Comparative Examples 1 and 2.

In Example 2 in which the silicon oxide thin-film was disposed on the chromium oxide thin-film and the nickel thin-film (160 nm) was formed on the silicon oxide thin-film, the adhesion was also excellent both before and after the heat treatment as in Example 1. From the comparison between Example 2 and Comparative Example 3, it can be seen that the chromium oxide thin-film disposed in contact with the hard coat layer contributes to the improvement of the adhesion. In addition, in Example 2, the TCR was higher than those in Comparative Examples 1 and 2 in which the thickness of the nickel thin-film was large, and was close to that in Example 1. From the comparison between these results, it can be seen that the electroconductive film in which the metal thin-film is disposed on the chromium oxide thin-film with the silicon oxide thin-film interposed therebetween exhibits a high TCR by the heat treatment and has excellent adhesion of the metal thin-film even after the heat treatment.

DESCRIPTION OF REFERENCE SIGNS 50 resin film base
5 resin film
6 hard coat layer
20 underlying layer
21 inorganic thin-film (chromium oxide thin-film)
22 inorganic thin-film (silicon oxide thin-film)
10 metal thin-film (nickel thin-film)
11 lead part
12 thermometric resistor part
122, 123 sensor wiring
19 connector
101 electroconductive film
110 temperature sensor film

The invention claimed is:

1. An electroconductive film for a temperature sensor, the electroconductive film comprising: a resin film base; a metal thin-film disposed on one principal surface of the resin film; and an underlying layer interposed between the resin film and the metal thin-film, wherein the underlying layer includes a chromium oxide thin-film and a silicon-based thin-film in this order from a side of the resin film base.

2. The electroconductive film according to claim 1, wherein a thickness of the underlying layer is 3 to 100 nm.

3. The electroconductive film according to claim 1, wherein the silicon-based thin-film is a silicon oxide thin-film.

4. The electroconductive film according to claim 1, wherein the metal thin-film is in contact with the silicon-based thin-film.

5. The electroconductive film according to claim 1, wherein the resin film base includes a hard coat layer formed on a surface of a resin film, and the underlying layer is disposed on the hard coat layer.

6. The electroconductive film according to claim 5, wherein the hard coat layer contains fine particles.

7. The electroconductive film according to claim 1, wherein the chromium oxide thin-film is in contact with the resin film base.

8. The electroconductive film according to claim 1, wherein the metal thin-film is formed of nickel or a nickel alloy.

9. The electroconductive film according to claim 1, wherein a temperature coefficient of resistance of the metal thin-film is 3,000 ppm/° C. or more.

10. The electroconductive film according to claim 1, wherein a thickness of the metal thin-film is 20 to 500 nm.

11. A method for producing the electroconductive film set forth in claim 1, the method comprising depositing the chromium oxide thin-film and the metal thin-film by a sputtering method.

12. A temperature sensor film comprising:
a resin film base; an underlying layer formed on one principal surface of the resin film base; and a metal thin-film patterned on the underlying layer, wherein
the metal thin-film is patterned to form a thermometric resistor part patterned into a thin wire and used for measuring a temperature and a lead part connected to the thermometric resistor part and patterned to have a larger wiring width than that of the thermometric resistor part, and
the underlying layer includes a chromium oxide thin-film and a silicon-based thin-film in this order from a side of the resin film base.

* * * * *